(12) United States Patent
Krasnov (10) Patent No.: US 8,502,066 B2
(45) Date of Patent: Aug. 6, 2013

(54) HIGH HAZE TRANSPARENT CONTACT INCLUDING INSERTION LAYER FOR SOLAR CELLS, AND/OR METHOD OF MAKING THE SAME

(75) Inventor: Alexey Krasnov, Canton, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 944 days.

(21) Appl. No.: 12/591,060

(22) Filed: Nov. 5, 2009

(65) Prior Publication Data
US 2011/0100445 A1 May 5, 2011

(51) Int. Cl.
*H01L 31/00* (2006.01)
(52) U.S. Cl.
USPC .......................................................... 136/256
(58) Field of Classification Search
USPC .......................................................... 136/256
See application file for complete search history.

(56) References Cited

U.S. PATENT DOCUMENTS

| | | |
|---|---|---|
| 3,411,934 A | 11/1968 | Englehart et al. |
| 4,163,677 A | 8/1979 | Carlson et al. |
| 4,378,460 A | 3/1983 | Williams |
| 4,532,373 A | 7/1985 | Matsuura et al. |
| 4,663,495 A | 5/1987 | Berman et al. |
| 5,091,764 A | 2/1992 | Asaoka et al. |
| 5,256,858 A | 10/1993 | Tomb |
| 5,667,853 A | 9/1997 | Fukuyoshi et al. |
| 5,861,189 A | 1/1999 | Sheel et al. |
| 6,048,621 A | 4/2000 | Gallego et al. |
| 6,123,824 A | 9/2000 | Sano et al. |
| 6,288,325 B1 | 9/2001 | Jansen et al. |
| 6,433,913 B1 | 8/2002 | Bauer et al. |
| 6,613,603 B1 | 9/2003 | Sano |
| 6,747,779 B1 | 6/2004 | Morin et al. |
| 6,784,361 B2 | 8/2004 | Carlson et al. |

(Continued)

FOREIGN PATENT DOCUMENTS

| | | |
|---|---|---|
| EP | 0 204 562 | 12/1986 |
| EP | 0 252 489 | 1/1988 |

(Continued)

OTHER PUBLICATIONS

U.S. Appl. No. 11/808,765, filed Jun. 12, 2007; Krasnov et al.

(Continued)

*Primary Examiner* — Jennifer Michener
*Assistant Examiner* — Shannon Gardner
(74) *Attorney, Agent, or Firm* — Nixon & Vanderhye P.C.

(57) ABSTRACT

Certain example embodiments of this invention relate to a front transparent conductive electrode for solar cell devices (e.g., amorphous silicon or a-Si solar cell devices), and/or methods of making the same. Advantageously, certain example embodiments enable high haze to be realized in the top layer of the thin film stack. In certain example embodiments, an insertion layer comprising ITO or AZO is provided between a layer of AZO and a layer of ITO. The AZO may be deposited at room temperature. The insertion layer is provided with an oxygen content selected so that the insertion layer sufficient to alter the crystalline growth of the layer of AZO compared to a situation where no insertion layer is provided. In certain example embodiments, the layer of ITO may be ion-beam treated so as to roughen a surface thereof. The ion beam treating may be performed a voltage sufficient to alter the crystalline growth of the layer of AZO compared to a situation where no insertion layer is provided.

36 Claims, 3 Drawing Sheets

U.S. PATENT DOCUMENTS

| | | | |
|---|---|---|---|
| 6,808,606 | B2 | 10/2004 | Thomsen et al. |
| 6,825,409 | B2 | 11/2004 | Haussler et al. |
| 6,827,970 | B2 | 12/2004 | Varanasi et al. |
| 6,852,555 | B1 | 2/2005 | Roman et al. |
| 6,975,067 | B2 | 12/2005 | McCormick et al. |
| 7,012,728 | B2 | 3/2006 | Morin et al. |
| 7,030,390 | B2 | 4/2006 | Veerasamy et al. |
| 7,037,869 | B2 | 5/2006 | Landa et al. |
| 7,087,834 | B2 | 8/2006 | McFarland |
| 7,144,837 | B2 | 12/2006 | Landa et al. |
| 7,169,722 | B2 | 1/2007 | Landa et al. |
| 7,183,559 | B2 | 2/2007 | Luten et al. |
| 7,198,699 | B2 | 4/2007 | Thomsen et al. |
| 7,229,533 | B2 | 6/2007 | Veerasamy |
| 7,311,975 | B2 | 12/2007 | Butz et al. |
| 7,405,411 | B2 | 7/2008 | Walton |
| 7,488,951 | B2 | 2/2009 | Murphy et al. |
| 7,563,347 | B2 | 7/2009 | Kriltz et al. |
| 2003/0064255 | A1 | 4/2003 | Dannenberg |
| 2004/0038051 | A1 | 2/2004 | Fujisawa et al. |
| 2004/0086723 | A1 | 5/2004 | Thomsen et al. |
| 2004/0113146 | A1 | 6/2004 | Dahmani et al. |
| 2005/0016583 | A1 | 1/2005 | Blieske et al. |
| 2005/0082493 | A1 | 4/2005 | Petrmichl |
| 2006/0099441 | A1 | 5/2006 | Teyssedre et al. |
| 2006/0169316 | A1 | 8/2006 | Thomsen et al. |
| 2006/0228564 | A1 | 10/2006 | Demiryont |
| 2006/0248923 | A1 | 11/2006 | Krasnov et al. |
| 2006/0249199 | A1 | 11/2006 | Thomsen et al. |
| 2007/0029187 | A1 | 2/2007 | Krasnov |
| 2008/0017112 | A1 | 1/2008 | Murphy |
| 2008/0096376 | A1 | 4/2008 | Li et al. |
| 2008/0105293 | A1 | 5/2008 | Lu et al. |
| 2008/0105298 | A1 | 5/2008 | Lu et al. |
| 2008/0199702 | A1 | 8/2008 | Murphy |
| 2008/0210303 | A1 | 9/2008 | Lu et al. |
| 2008/0302414 | A1 | 12/2008 | Den Boer et al. |
| 2009/0084438 | A1 | 4/2009 | Den Boer et al. |
| 2009/0194157 | A1 | 8/2009 | Den Boer et al. |
| 2009/0293945 | A1* | 12/2009 | Peter .......................... 136/255 |

FOREIGN PATENT DOCUMENTS

| | | |
|---|---|---|
| EP | 0 372 929 | 6/1990 |
| EP | 987774 A2 | 3/2000 |
| EP | 1 115 160 | 7/2001 |
| EP | 1 174 397 | 1/2002 |
| EP | 1 343 176 | 9/2003 |

OTHER PUBLICATIONS

U.S. Appl. No. 11/812,078, filed Jun. 14, 2007; Krasnov et al.

U.S. Appl. No. 11/898,641, filed Sep. 13, 2007; Lu et al.

"Improved Fill Factors in Amorphous Silicon Solar Cells on Zinc Oxide by Insertion of a Germanium Layer to Block Impurity Incorporation", Ganguly et al., Applied Physics Letters, vol. 85, No. 3, Jul. 19, 2004, pp. 479-481.

"Improved Transparent Conductive Oxide/p$^+$/i Junction in Amorphous Silicon Solar Cells by Tailored Hydrogen Flux During Growth", Nuruddin et al., Thin Solid Films 394 (2001) pp. 49-63.

"Work Function Determination of Zinc Oxide Films", Sundaram et al., J. Vac. Sci. Technol. A. 15(2), Mar./Apr. 1997, pp. 428-430.

"Optoelectronic Properties of Thin Amorphous and Micro-Crystalline P-Type Films Developed for Amorphous Silicon-Based Solar Cells", Winz et al., Materials Research Society Symposium Proceedings vol. 420, Apr. 1996.

"Investigation of Indium Tin Oxide/Zinc Oxide Multilayer Ohmic Contacts to n-Type GaN Isotype Conjunction", Lee et al., Applied Physics Letters, Vol, 78, No. 22, May 28, 2001, pp. 3412-3414.

"The Insert of Zinc Oxide Thin Film in Indium Tin Oxide Anode for Organic Electroluminescence Devices", Jeong et al., Current Applied Physics4 (2004) 655-658.

U.S. Appl. No. 11/790,687, filed Apr. 26, 2007.

U.S. Appl. No. 11/591,668, filed Nov. 2, 2006.

"Improvement in Quantum Efficiency of Thin Film Si Solar Cells Due to the Suppression of Optical Reflectance at Transparent Conducting Oxide/Si Interface by $TiO_2$/ZnO Antireflection Coating", Fujibayashi et al., Applied Physics Letters 88, (2006) (2pgs).

"Thin-Film Compound Semiconductor Photovoltaics", Shafarman et al., Materials Research Society, vol. 865, Mar. 29-Apr. 1, 2005.

U.S. Appl. No. 11/790,812, filed Apr. 27, 2007.

U.S. Appl. No. 11/653,431, filed Jan. 16, 2007.

U.S. Appl. No. 11/600,912, filed Nov. 17, 2006.

P2-39 Soda Lime Glass as a Substrate for TFT-LCDs, Uchikoga et al., Japan Display '89, Oct. 16-18, pp. 426-429.

"Improved Three-Dimensional Optical Model for Thin-Film Silicon Solar Cells", Springer et al., Journal of Applied Physics, vol. 96, No. 9, Nov. 1, 2004.

"TCO and Light Trapping in Silicon Thin Film Solar Cells", Müller et al., Solar Energy 77 (2004) pp. 917-930.

"Stability of Transparent Conducting Tin Oxide Films Deposited by Sputtering for Solar Cells Applications", Wang et al., 2009 IEEE; pp. 676-679.

"Optimization of Electrical and Optical Properties in Multilayer TCO Thin Film Structures", George et al., 2009 IEEE; pp. 440-444.

"Magnetron Sputtered AZO Thin Films on Commercial ITO Glass for Application of a Very Low Resistance Transparent Electrode", Fang et al., Journal of Physics D. Applied Physics, vol. 35, Jan. 1, 2002.

* cited by examiner

HIGH HAZE TRANSPARENT CONTACT INCLUDING INSERTION LAYER FOR SOLAR CELLS, AND/OR METHOD OF MAKING THE SAME

FIELD OF THE INVENTION

Certain example embodiments of this invention relate to solar cell devices, and/or methods of making the same. More particularly, certain example embodiments relate to a front transparent conductive electrode for solar cell devices (e.g., amorphous silicon or a-Si solar cell devices), and/or methods of making the same. Certain example embodiments advantageously enable high haze to be realized in the top layer of the thin film stack.

BACKGROUND AND SUMMARY OF EXAMPLE EMBODIMENTS OF THE INVENTION

Photovoltaic devices are known in the art (e.g., see U.S. Pat. Nos. 6,784,361, 6,288,325, 6,613,603, and 6,123,824, the disclosures of which are hereby incorporated herein by reference). Amorphous silicon photovoltaic devices, for example, include a front electrode or contact. Typically, the transparent front electrode is made of a pyrolytic transparent conductive oxide (TCO) such as zinc oxide or tin oxide formed on a substrate such as a glass substrate. In many instances, the transparent front electrode is formed of a single layer using a method of chemical pyrolysis where precursors are sprayed onto the glass substrate at approximately 400 to 600 degrees C. Typical pyrolitic fluorine-doped tin oxide TCOs as front electrodes may be about 1000 nm thick, which provides for a sheet resistance ($R_s$) of about 15 ohms/square. To achieve high output power, a front electrode having a low sheet resistance and good ohm-contact to the cell top layer, and allowing maximum solar energy in certain desirable ranges into the absorbing semiconductor film, are desired.

Unfortunately, photovoltaic devices (e.g., solar cells) with only such conventional TCO front electrodes suffer from various problems.

First, a pyrolitic fluorine-doped tin oxide TCO about 1000 nm thick as the entire front electrode has a sheet resistance ($R_s$) of about 15 ohms/square which is rather high for the entire front electrode. A lower sheet resistance (and thus better conductivity) would be desired for the front electrode of a photovoltaic device. A lower sheet resistance may be achieved by increasing the thickness of such a TCO, but this will cause transmission of light through the TCO to drop thereby reducing output power of the photovoltaic device.

Second, conventional TCO front electrodes such as pyrolytic tin oxide allow a significant amount of infrared (IR) radiation to pass therethrough thereby allowing it to reach the semiconductor or absorbing layer(s) of the photovoltaic device. This IR radiation causes heat which increases the operating temperature of the photovoltaic device thereby decreasing the output power thereof.

Third, conventional TCO front electrodes such as pyrolytic tin oxide tend to reflect a significant amount of light in the region of from about 450-700 nm so that less than about 80% of useful solar energy reaches the semiconductor absorbing layer; this significant reflection of visible light is a waste of energy and leads to reduced photovoltaic module output power. Due to the TCO absorption and reflections of light which occur between the TCO (refractive index n about 1.8 to 2.0 at 550 nm) and the thin film semiconductor (n about 3.0 to 4.5), and between the TCO and the glass substrate (n about 1.5), the TCO coated glass at the front of the photovoltaic device typically allows less than 80% of the useful solar energy impinging upon the device to reach the semiconductor film which converts the light into electric energy.

Fourth, the rather high total thickness (e.g., 400 nm) of the front electrode in the case of a 1000 nm thick tin oxide TCO, leads to high fabrication costs.

Fifth, the process window for forming a zinc oxide or tin oxide TCO for a front electrode is both small and important. In this respect, even small changes in the process window can adversely affect conductivity of the TCO. When the TCO is the sole conductive layer of the front electrode, such adverse affects can be highly detrimental.

Thus, it will be appreciated that there is a need in the art for solar cell devices, and/or methods of making the same.

One aspect of certain example embodiments relates to a solar cell comprising a superstrate including aluminum-doped zinc oxide (AZO), wherein high haze is created. In certain example embodiments, the AZO may be provided at room temperature. It will be appreciated that this is advantageous, as temperatures around 200 degrees C. typically are used in connection with a-Si semiconductor processing. Certain example embodiments relate to the deposition of AZO at a temperature less than 200 degrees C., more preferably less than 100 degrees C., and more preferably at or around room temperature.

Another aspect of certain example embodiments relates to the provision of an insertion layer comprising AZO or ITO. The insertion layer may be sub-oxidized in certain example embodiments. Alternatively, or in addition, an ion beam may be used to reduce the effects associated with the ITO's crystallinity when AZO is provided thereon in certain example embodiments. In certain example embodiments, a single graded ITO layer or a single graded AZO layer may be provided in place of, or in addition to, an insertion layer.

In certain example embodiments, a method of making a front contact for a solar cell is provided. A glass substrate is provided. A dielectric coating is disposed on the glass substrate. A layer of ITO is disposed on the dielectric coating. A layer of AZO is sputter deposited on the layer of ITO, with the layer of AZO being sputter-deposited at a temperature less than 200 degrees C. The layer of AZO is etched. The substrate is baked and/or heat treated together with the dielectric coating, the layer of ITO, and the layer of AZO.

According to certain example embodiments, an insertion layer is provided between the layer of AZO and the layer of ITO. The insertion layer may comprise sub-oxidized ITO in certain example embodiments, and/or the insertion layer may have an absorption of 3-6% per 100 nm of thickness in certain example embodiments. The insertion layer may comprise sub-oxidized AZO in certain example embodiments, and/or the insertion layer may have an absorption of 2-8% (integrated over a wavelength range from 400 to 700 nm, for example) per 100 nm of thickness in certain example embodiments. According to certain example embodiments, the insertion layer may shift the 002 peak of the layer of AZO compared to a situation where no insertion layer is provided.

In certain example embodiments, a method of making a front contact for a solar cell is provided. A glass substrate is provided. A dielectric coating is sputter-deposited on the glass substrate. A layer of ITO is sputter-deposited on the dielectric coating. A layer of AZO is sputter-deposited on the layer of ITO. An insertion layer including sub-oxidized ITO or sub-oxidized AZO is sputter-deposited between the layer of AZO and the layer of ITO, with the insertion layer altering the crystalline growth of the layer of AZO compared to a situation where no insertion layer is provided.

In certain example embodiments, a method of making a front contact for a solar cell is provided. A glass substrate is provided. A dielectric coating is sputter-deposited on the glass substrate. A layer of ITO is sputter-deposited on the dielectric coating. The layer of ITO is treated with an ion beam to roughen a surface thereof, with the ion beam treating being performed at a voltage greater than 500 V. A layer of AZO is sputter-deposited on the layer of ITO. The ion beam treating alters the crystalline growth of the layer of AZO compared to a situation where no ion beam treating is performed.

Methods of making solar cells also are provided. Such methods may include connecting the front contact of certain example embodiments to an a-Si semiconductor layer and/or the like.

Certain example embodiments of this invention also relate to front contacts and/or solar cells produced using these and/or other methods.

The features, aspects, advantages, and example embodiments described herein may be combined to realize yet further embodiments.

BRIEF DESCRIPTION OF THE DRAWINGS

These and other features and advantages may be better and more completely understood by reference to the following detailed description of exemplary illustrative embodiments in conjunction with the drawings, of which.

DETAILED DESCRIPTION OF EXAMPLE EMBODIMENTS OF THE INVENTION

Photovoltaic devices such as solar cells convert solar radiation into usable electrical energy. The energy conversion occurs typically as the result of the photovoltaic effect. Solar radiation (e.g., sunlight) impinging on a photovoltaic device and absorbed by an active region of semiconductor material (e.g., a semiconductor film including one or more semiconductor layers such as a-Si layers, the semiconductor sometimes being called an absorbing layer or film) generates electron-hole pairs in the active region. The electrons and holes may be separated by an electric field of a junction in the photovoltaic device. The separation of the electrons and holes by the junction results in the generation of an electric current and voltage. In certain example embodiments, the electrons flow toward the region of the semiconductor material having n-type conductivity, and holes flow toward the region of the semiconductor having p-type conductivity. Current can flow through an external circuit connecting the n-type region to the p-type region as light continues to generate electron-hole pairs in the photovoltaic device.

In certain example embodiments, single junction amorphous silicon (a-Si) photovoltaic devices include three semiconductor layers. In particular, a p-layer, an n-layer and an i-layer which is intrinsic. The amorphous silicon film (which may include one or more layers such as p, n and i type layers) may be of hydrogenated amorphous silicon in certain instances, but may also be of or include hydrogenated amorphous silicon carbon or hydrogenated amorphous silicon germanium, or the like, in certain example embodiments of this invention. For example and without limitation, when a photon of light is absorbed in the i-layer it gives rise to a unit of electrical current (an electron-hole pair). The p and n-layers, which contain charged dopant ions, set up an electric field across the i-layer which draws the electric charge out of the i-layer and sends it to an optional external circuit where it can provide power for electrical components. It is noted that while certain example embodiments of this invention are directed toward amorphous-silicon based photovoltaic devices, this invention is not so limited and may be used in conjunction with other types of photovoltaic devices in certain instances including but not limited to devices including other types of semiconductor material, single or tandem thin-film solar cells, CdS and/or CdTe (including CdS/CdTe) photovoltaic devices, polysilicon and/or microcrystalline Si photovoltaic devices, and the like.

Figure 1:
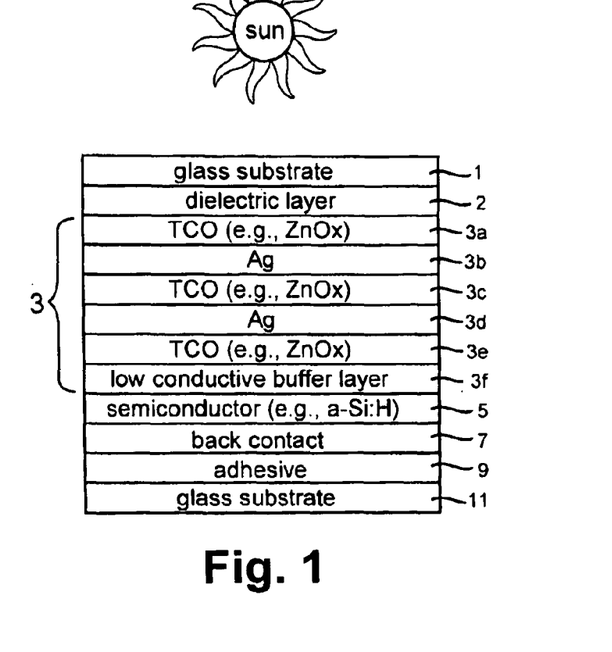
FIG. 1 is a cross sectional view of an example photovoltaic device according to an example embodiment of this invention.

FIG. 1 is a cross sectional view of a photovoltaic device according to an example embodiment of this invention. The photovoltaic device includes transparent front glass substrate 1 (other suitable material may also be used for the substrate instead of glass in certain instances), optional dielectric layer(s) 2, multilayer front electrode 3, active semiconductor film 5 of or including one or more semiconductor layers (such as pin, pn, pinpin tandem layer stacks, or the like), back electrode/contact 7 which may be of a TCO or a metal, an optional encapsulant 9 or adhesive of a material such as ethyl vinyl acetate (EVA) or the like, and an optional superstrate 11 of a material such as glass. Of course, other layer(s) which are not shown may also be provided in the device. Front glass substrate 1 and/or rear superstrate (substrate) 11 may be made of soda-lime-silica based glass in certain example embodiments of this invention; and it may have low iron content and/or an antireflection coating thereon to optimize transmission in certain example instances. While substrates 1, 11 may be of glass in certain example embodiments of this invention, other materials such as quartz, plastics or the like may instead be used for substrate(s) 1 and/or 11. Moreover, superstrate 11 is optional in certain instances. Glass 1 and/or 11 may or may not be thermally tempered and/or patterned in certain example embodiments of this invention. Additionally, it will be appreciated that the word "on" as used herein covers both a layer being directly on and indirectly on something, with other layers possibly being located therebetween.

Dielectric layer(s) 2 may be of any substantially transparent material such as a metal oxide and/or nitride which has a refractive index of from about 1.5 to 2.5, more preferably from about 1.6 to 2.5, more preferably from about 1.6 to 2.2, more preferably from about 1.6 to 2.0, and most preferably from about 1.6 to 1.8. However, in certain situations, the dielectric layer 2 may have a refractive index (n) of from about 2.3 to 2.5. Example materials for dielectric layer 2 include silicon oxide, silicon nitride, silicon oxynitride, zinc oxide, tin oxide, titanium oxide (e.g., $TiO_2$), aluminum oxynitride, aluminum oxide, or mixtures thereof. Dielectric layer(s) 2 functions as a barrier layer in certain example embodiments of this invention, to reduce materials such as sodium from migrating outwardly from the glass substrate 1 and reaching the IR reflecting layer(s) and/or semiconductor. Moreover, dielectric layer 2 is material having a refractive index (n) in the range discussed above, in order to reduce visible light reflection and thus increase transmission of visible light (e.g., light from about 450-700 nm and/or 450-600 nm) through the coating and into the semiconductor 5 which leads to increased photovoltaic module output power.

Still referring to FIG. 1, multilayer front electrode 3 in the example embodiment shown in FIG. 1, which is provided for purposes of example only and is not intended to be limiting, includes from the glass substrate 1 outwardly first transparent conductive oxide (TCO) or dielectric layer 3a, first conductive substantially metallic IR reflecting layer 3b, second TCO 3c, second conductive substantially metallic IR reflecting layer 3d, third TCO 3e, and optional buffer layer 3f. Optionally, layer 3a may be a dielectric layer instead of a TCO in certain example instances and serve as a seed layer for the layer 3b. This multilayer film 3 makes up the front electrode in certain example embodiments of this invention. Of course, it is possible for certain layers of electrode 3 to be removed in certain alternative embodiments of this invention (e.g., one or more of layers 3a, 3c, 3d and/or 3e may be removed), and it is also possible for additional layers to be provided in the multilayer electrode 3. Front electrode 3 may be continuous across all or a substantial portion of glass substrate 1, or alternatively may be patterned into a desired design (e.g., stripes), in different example embodiments of this invention. Each of layers/films 1-3 is substantially transparent in certain example embodiments of this invention.

First and second conductive substantially metallic IR reflecting layers 3b and 3d may be of or based on any suitable IR reflecting material such as silver, gold, or the like. These materials reflect significant amounts of IR radiation, thereby reducing the amount of IR which reaches the semiconductor film 5. Since IR increases the temperature of the device, the reduction of the amount of IR radiation reaching the semiconductor film 5 is advantageous in that it reduces the operating temperature of the photovoltaic module so as to increase module output power. Moreover, the highly conductive nature of these substantially metallic layers 3b and/or 3d permits the conductivity of the overall electrode 3 to be increased. In certain example embodiments of this invention, the multilayer electrode 3 has a sheet resistance of less than or equal to about 12 ohms/square, more preferably less than or equal to about 9 ohms/square, and even more preferably less than or equal to about 6 ohms/square. Again, the increased conductivity (same as reduced sheet resistance) increases the overall photovoltaic module output power, by reducing resistive losses in the lateral direction in which current flows to be collected at the edge of cell segments. It is noted that first and second conductive substantially metallic IR reflecting layers 3b and 3d (as well as the other layers of the electrode 3) are thin enough so as to be substantially transparent to visible light. In certain example embodiments of this invention, first and/or second conductive substantially metallic IR reflecting layers 3b and/or 3d are each from about 3 to 12 nm thick, more preferably from about 5 to 10 nm thick, and most preferably from about 5 to 8 nm thick. In embodiments where one of the layers 3b or 3d is not used, then the remaining conductive substantially metallic IR reflecting layer may be from about 3 to 18 nm thick, more preferably from about 5 to 12 nm thick, and most preferably from about 6 to 11 nm thick in certain example embodiments of this invention. These thicknesses are desirable in that they permit the layers 3b and/or 3d to reflect significant amounts of IR radiation, while at the same time being substantially transparent to visible radiation which is permitted to reach the semiconductor 5 to be transformed by the photovoltaic device into electrical energy. The highly conductive IR reflecting layers 3b and 3d attribute to the overall conductivity of the electrode 3 much more than the TCO layers; this allows for expansion of the process window(s) of the TCO layer(s) which has a limited window area to achieve both high conductivity and transparency.

First, second, and third TCO layers 3a, 3c and 3e, respectively, may be of any suitable TCO material including but not limited to conducive forms of zinc oxide, zinc aluminum oxide, tin oxide, indium-tin-oxide, indium zinc oxide (which may or may not be doped with silver), or the like. These layers are typically substoichiometric so as to render them conductive as is known in the art. For example, these layers are made of material(s) which gives them a resistance of no more than about 10 ohm-cm (more preferably no more than about 1 ohm-cm, and most preferably no more than about 20 mohm-cm). One or more of these layers may be doped with other materials such as fluorine, aluminum, antimony or the like in certain example instances, so long as they remain conductive and substantially transparent to visible light. In certain example embodiments of this invention, TCO layers 3c and/or 3e are thicker than layer 3a (e.g., at least about 5 nm, more preferably at least about 10, and most preferably at least about 20 or 30 nm thicker). In certain example embodiments of this invention, TCO layer 3a is from about 3 to 80 nm thick, more preferably from about 5-30 nm thick, with an example thickness being about 10 nm. Optional layer 3a is provided mainly as a seeding layer for layer 3b and/or for antireflection purposes, and its conductivity is not as important as that of layers 3b-3e (thus, layer 3a may be a dielectric instead of a TCO in certain example embodiments). In certain example embodiments of this invention, TCO layer 3c is from about 20 to 150 nm thick, more preferably from about 40 to 120 nm thick, with an example thickness being about 74-75 nm. In certain example embodiments of this invention, TCO layer 3e is from about 20 to 180 nm thick, more preferably from about 40 to 130 nm thick, with an example thickness being about 94 or 115 nm. In certain example embodiments, part of layer 3e, e.g., from about 1-25 nm or 5-25 nm thick portion, at the interface between layers 3e and 5 may be replaced with a low conductivity high refractive index (n) film 3f such as titanium oxide to enhance transmission of light as well as to reduce back diffusion of generated electrical carriers; in this way performance may be further improved.

In certain example embodiments of this invention, the photovoltaic device may be made by providing glass substrate 1, and then depositing (e.g., via sputtering or any other suitable technique) multilayer electrode 3 on the substrate 1. Thereafter the structure including substrate 1 and front electrode 3 is coupled with the rest of the device in order to form the photovoltaic device shown in FIG. 1. For example, the semiconductor layer 5 may then be formed over the front electrode on substrate 1. Alternatively, the back contact 7 and semiconductor 5 may be fabricated/formed on substrate 11 (e.g., of glass or other suitable material) first; then the electrode 3 and dielectric 2 may be formed on semiconductor 5 and encapsulated by the substrate 1 via an adhesive such as EVA.

The alternating nature of the TCO layers 3a, 3c and/or 3e, and the conductive substantially metallic IR reflecting layers 3b and/or 3d, is also advantageous in that it also one, two, three, four or all of the following advantages to be realized: (a) reduced sheet resistance ($R_s$) of the overall electrode 3 and thus increased conductivity and improved overall photovoltaic module output power; (b) increased reflection of infrared (IR) radiation by the electrode 3 thereby reducing the operating temperature of the semiconductor 5 portion of the photovoltaic module so as to increase module output power; (c) reduced reflection and increased transmission of light in the visible region of from about 450-700 nm (and/or 450-600 nm) by the front electrode 3 which leads to increased photovoltaic module output power; (d) reduced total thickness of the front electrode coating 3 which can reduce fabrication costs and/or time; and/or (e) an improved or enlarged process window in forming the TCO layer(s) because of the reduced impact of the TCO's conductivity on the overall electric properties of the module given the presence of the highly conductive substantially metallic layer(s).

The active semiconductor region or film 5 may include one or more layers, and may be of any suitable material. For example, the active semiconductor film 5 of one type of single junction amorphous silicon (a-Si) photovoltaic device includes three semiconductor layers, namely a p-layer, an n-layer and an i-layer. The p-type a-Si layer of the semiconductor film 5 may be the uppermost portion of the semiconductor film 5 in certain example embodiments of this invention; and the i-layer is typically located between the p and n-type layers. These amorphous silicon based layers of film 5 may be of hydrogenated amorphous silicon in certain instances, but may also be of or include hydrogenated amorphous silicon carbon or hydrogenated amorphous silicon germanium, hydrogenated microcrystalline silicon, or other suitable material(s) in certain example embodiments of this invention. It is possible for the active region 5 to be of a double-junction or triple-junction type in alternative embodiments of this invention. CdTe may also be used for semiconductor film 5 in alternative embodiments of this invention.

Back contact, reflector and/or electrode 7 may be of any suitable electrically conductive material. For example and without limitation, the back contact or electrode 7 may be of a TCO and/or a metal in certain instances. Example TCO materials for use as back contact or electrode 7 include indium zinc oxide, indium-tin-oxide (ITO), tin oxide, and/or zinc oxide which may be doped with aluminum (which may or may not be doped with silver). The TCO of the back contact 7 may be of the single layer type or a multi-layer type in different instances. Moreover, the back contact 7 may include both a TCO portion and a metal portion in certain instances. For example, in an example multi-layer embodiment, the TCO portion of the back contact 7 may include a layer of a material such as indium zinc oxide (which may or may not be doped with silver), indium-tin-oxide (ITO), tin oxide, and/or zinc oxide closest to the active region 5, and the back contact may include another conductive and possibly reflective layer of a material such as silver, molybdenum, platinum, steel, iron, niobium, titanium, chromium, bismuth, antimony, or aluminum further from the active region 5 and closer to the superstrate 11. The metal portion may be closer to superstrate 11 compared to the TCO portion of the back contact 7.

The photovoltaic module may be encapsulated or partially covered with an encapsulating material such as encapsulant 9 in certain example embodiments. An example encapsulant or adhesive for layer 9 is EVA or PVB. However, other materials such as Tedlar type plastic, Nuvasil type plastic, Tefzel type plastic or the like may instead be used for layer 9 in different instances.

Given the structure identified above, certain example embodiments relate to a front transparent conductive electrode for solar cell devices (e.g., amorphous silicon or a-Si solar cell devices), and/or methods of making the same. Certain example embodiments enable advantageously enable high haze to be realized in the top layer of the thin film stack.

The front transparent contact of a typical superstrate thin film amorphous silicon (a-Si) solar cell includes a glass base supporting a transparent conductive film. As indicated above, this transparent conductive film typically includes pyrolytically deposited fluorine-doped tin oxide ($SnO_2$:F). The efficiency of a-Si modules sometimes may be increased by 20% via surface texturing of the transparent conductor on which the a-Si semiconductor is deposited for the effective light scattering into the semiconductor layer of the device. The pyrolytically deposited $SnO_2$:F typically is "naturally" textured during its deposition.

Sputter-deposited aluminum-doped zinc oxide (AZO) may be used as an alternative to pyrolytically deposited $SnO_2$:F. The AZO may be chemically etched following its deposition. The etching process may create sufficient roughness of the AZO surface to produce the needed light scattering. Unfortunately, however, the chemical etching often results in a substantial thickness loss of the AZO layer. This generally requires depositing a relatively thick (e.g., about 1 micron thick) sputter-deposited AZO layer to provide a sufficiently low sheet resistance. As will be appreciated, the low sheet resistance of the transparent contact is needed for the effective extraction of electrical charges generated in the device.

An alternative technique for achieving a sufficient lateral conductivity of the textured transparent contact is to deposit an additional highly conductive transparent layer such as, for example, indium tin oxide (ITO), below the AZO. In such a case, the AZO deposited on the ITO film may be made substantially thinner. This technique may offer certain advantages over a single layer AZO design, e.g., when the deposition (of some or all layers) is performed without intentional heating of the substrate (and/or the layers thereon). In other words, this technique may offer certain advantages over a single layer AZO design when the deposition is performed approximately at room temperature, thereby resulting in RT-AZO. The stack may require post-deposition baking (e.g., at about 300-500 degrees C.) to reduce optical absorption and electrical resistivity of the transparent electrode.

To achieve the desired optical and electrical performance of sputtered RT-AZO, the use of near-stoichiometric ceramic AZO targets may be desirable. For example, using close-to-stoichiometric ceramic AZO targets may make it easier to optimize the composition of the RT-AZO deposit film by incorporating oxygen during the post-deposition baking. One disadvantage of using stoichiometric targets for the AZO deposition on ITO is that the crystalline ITO has a tendency to inhibit haze in stoichiometric AZO during texturing. This also applies to high-temperature AZO (HT-AZO) deposited on the ITO layer.

Figure 2:
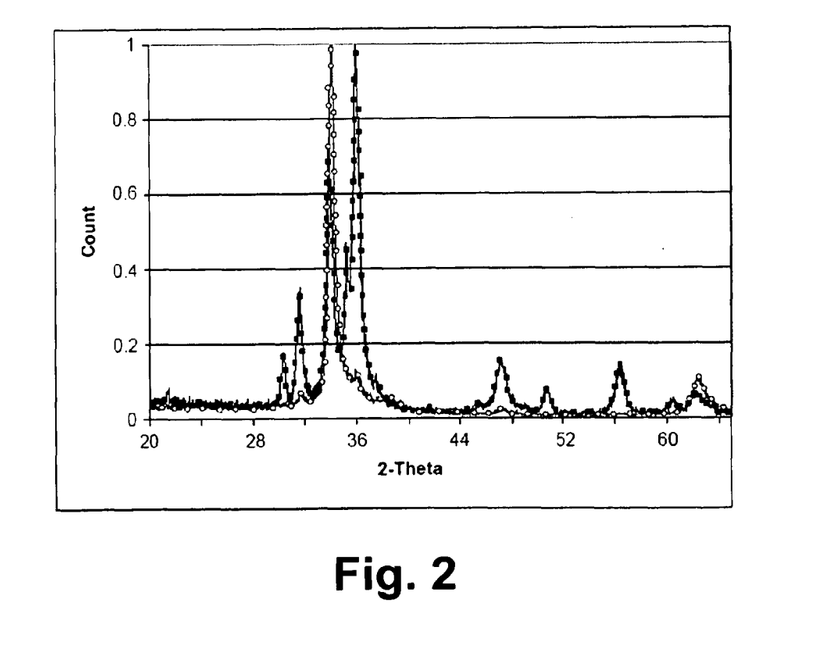
FIG. 2 is an example XRD showing AZO with and without an ITO underlayer.

One reason that the ITO layer affects haze development in AZO relates to the fact that the ability of the AZO layer to produce haze depends on the ratio of strain in the film in the directions parallel and perpendicular to its growth axis. In AZO deposited on an amorphous substrate, this ratio is sufficient to result in a high haze. The presence of the crystalline ITO layer, however, affects the crystallinity of the AZO and results in the reduced strain ratio. This, in turn, results in a reduced difference of the etch rate in the two orthogonal directions of the crystalline AZO and, ultimately, in a low haze. FIG. 2 is an example XRD showing AZO with (solid squares) and without (hollow circles) an ITO underlayer.

Figure 3:
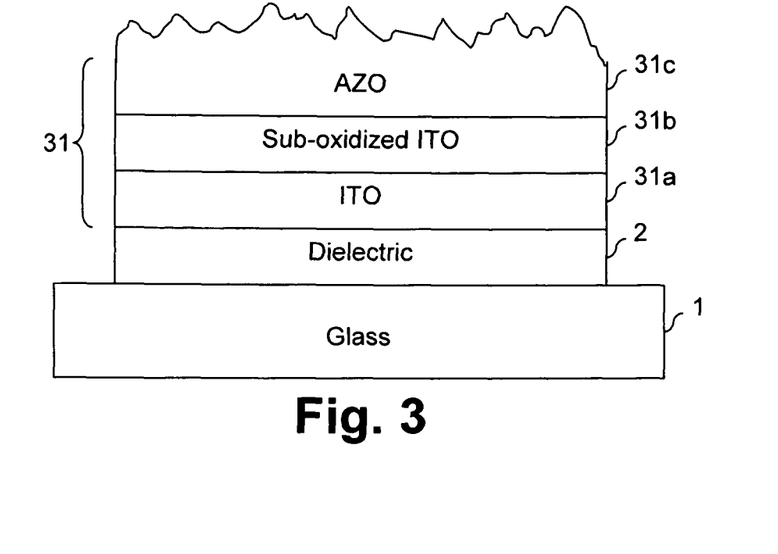
FIG. 3 is a first example layer stack for producing high haze in connection with a textured stoichiometric AZO layer deposited on an ITO layer in accordance with an example embodiment of this invention.
Figure 4:
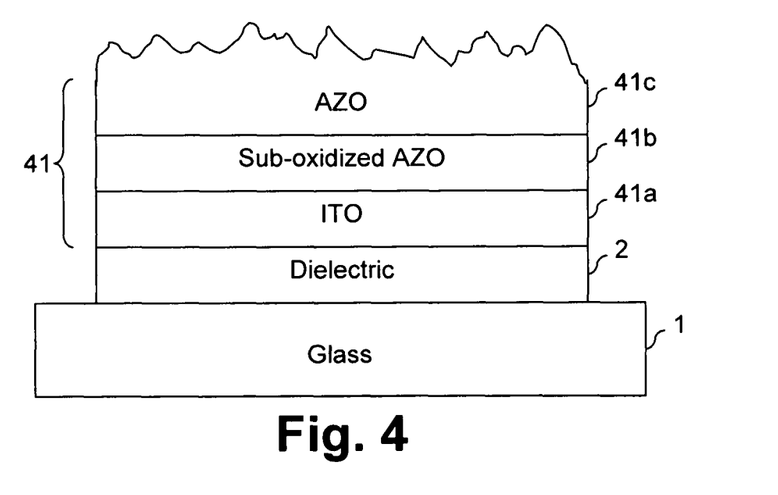
FIG. 4 is a second example layer stack for producing high haze in connection with a textured stoichiometric AZO layer deposited on an ITO layer in accordance with an example embodiment of this invention.
Figure 5:
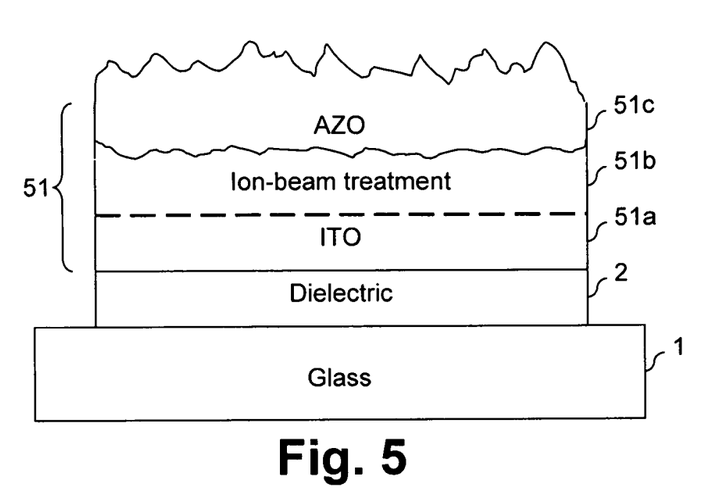
FIG. 5 is a third example layer stack for producing high haze in connection with a textured stoichiometric AZO layer deposited on an ITO layer in accordance with an example embodiment of this invention.

Certain example embodiments therefore relate to techniques that produce high haze in textured stoichiometric AZO deposited on an ITO film. This may be accomplished using one or more of the following and/or other example techniques. The resulting layer stacks are shown in FIGS. 3-5 (described in greater detail below). In brief, FIGS. 3-5 each show approaches for producing high haze in connection with a textured stoichiometric AZO layer deposited (directly or indirectly) on an ITO layer in accordance with example embodiments of this invention.

First, a substantially sub-oxidized AZO layer may be provided between the ITO layer and the stoichiometric AZO layer. This example technique may result in an "amorphozation" of the lower portion of the AZO layer and/or the upper portion of the ITO layer. This tends to reduce (and sometimes even cancel out) the effect of the crystalline ITO on the AZO layer.

This first illustrative arrangement is shown, for example, in FIG. 3. The FIG. 3 example embodiment includes a glass substrate 1, which supports a dielectric layer 2 and a multi-layer transparent conductive coating (TCC) 31. The underlying dielectric layer 2 supports the TCC 31, which may comprise (in order moving away from the dielectric layer 2), an ITO layer 31a, a sub-oxidized ITO layer 31b, and a layer of textured AZO 31c. The ITO layer 31a and/or the AZO 31c may be stoichiometric or substantially stoichiometric in different embodiments of this invention. It will be appreciated that the sub-oxidized ITO layer 31b will contain less oxygen than the "main" ITO layer 31a. In certain example embodiments, the "main" ITO layer 31a also may be sub-oxidized. However, even in embodiments where the "main" ITO layer 31a is sub-oxidized, the sub-oxidized ITO layer 31b still will contain less oxygen than the "main" ITO layer 31a. In certain example embodiments, the sub-oxidized ITO layer 31b preferably has an absorption of 3-6% per 100 nm of thickness, more preferably 4.5% per 100 nm of thickness. In certain example embodiments, the sub-oxidized ITO layer 31b may have optical constants n and k of 1.9-2.05 and 0.005-0.025, respectively, at 550 nm, and more preferably 1.97 and 0.01, respectively at 550 nm.

In certain example embodiments, the ITO layer 31a and/or the AZO 31c may have a refractive index of about 1.9-2.05 at 550 nm. In certain example embodiments, the ITO layer 31a may be provided at a thickness of 50-500 nm, more preferably 100-300 nm, and still more preferably at about 200 nm. In certain example embodiments, the AZO 31c may be provided at a thickness of 300-1000 nm, more preferably 400-700 nm, and still more preferably at about 500 nm. In certain example embodiments, the sub-oxidized ITO layer 31b may be provided at a thickness of 10-200 nm, more preferably 20-100 nm, and still more preferably at about 40 nm.

A conductive layer of or comprising Ag (not shown in FIG. 3) may be deposited above and/or below the ITO layer 31a in certain example embodiments. This Ag-based layer may be highly conductive and may be deposited to a thickness of 0.5-3 nm, more preferably 0.7-2 nm, and sometimes to about 1 nm.

In certain example embodiments, rather than providing two separate ITO layers 31a and 31b, a single graded ITO layer (not shown) may be provided, such that the oxygen content is higher closer to the dielectric layer 2 and lower closer to the AZO layer 31c. In certain example embodiments, even when separate ITO layers 31a and 31b are provided, one or both of such layers may be graded, e.g., as described above. In certain example embodiments AZO etching may be performed using a 5% acetic acid solution.

The sub-oxidized ITO layer 31b, provided as an insertion layer, may help serve as an etch stop. In general, absent the insertion layer comprising sub-oxidized ITO layer 31b, the crystallinity of the underlying "main" ITO layer 31a will affect the growth of the AZO and reduce haze because it tends to inhibit large peak/valley formation. Similar principles apply when a single, graded ITO layer is provided. In certain example embodiments, the crystallinity of the AZO will be changed, creating an enlarged peak-to-valley distance, e.g., by enabling the AZO to form higher peaks and/or lower valleys. In particular, in certain example embodiments, the 002 peak will shift, causing the etch rate in the horizontal vs. vertical directions change together and, for example, producing deeper valleys.

Second, a substantially sub-oxidized ITO layer may be provided between stoichiometric ITO and AZO layers. Like the first example technique, this second example technique also may result in an "amorphozation" of the lower portion of the AZO layer and/or the upper portion of the ITO layer, which tends to reduce (and sometimes even cancel out) the effect of the crystalline ITO on the AZO layer.

This second illustrative arrangement is shown, for example, in FIG. 4. The FIG. 4 example embodiment is similar to the FIG. 3 example embodiment in that it includes a glass substrate 1, which supports a dielectric layer 2 and a multilayer transparent conductive coating (TCC) 41. The underlying dielectric layer 2 supports the TCC 41, which may comprise (in order moving away from the dielectric layer 2), an ITO layer 41a, a sub-oxidized AZO layer 41b, and a layer of textured AZO 41c. It will be appreciated that the sub-oxidized AZO layer 41b will contain less oxygen than the "main" AZO layer 41c. In certain example embodiments, the "main" AZO layer 41c also may be sub-oxidized. However, even in embodiments where the "main" AZO layer 41c is sub-oxidized, the sub-oxidized AZO layer 41b still will contain less oxygen than the "main" AZO layer 41c.

The sub-oxidized AZO layer 41b in certain example embodiments preferably has an absorption of 2-8% per 100 nm of thickness, and sometimes around 5.3% per 100 nm of thickness. The thickness of the sub-oxidized AZO layer 41b in certain example embodiments is 10-200 nm, more preferably 20-100 nm, and sometimes is preferably about 40 nm. In certain example embodiments, the sub-oxidized AZO layer 41b may have optical constants n and k of 1.93 and 0.008, respectively, at 550 nm.

In certain example embodiments, rather than providing two separate AZO layers 31b and 31c, a single graded AZO layer (not shown) may be provided, such that the oxygen content is higher further from the substrate 1 and lower closer to the substrate 1. In certain example embodiments, even when separate AZO layers 41b and 41c are provided, one or both of such layers may be graded, e.g., as described above.

Similar to the above, the sub-oxidized AZO layer 31b, provided as an insertion layer, may help serve as an etch stop and may help reduce the effects of the underlying ITO's crystallinity. Also, similar principles apply when a single, graded AZO layer is provided.

In certain example embodiments, an over-oxidized layer may be introduced adjacent to the sub-oxided insertion layer. For instance, in the FIG. 3 example embodiment, an over-oxidized ITO layer may be provided adjacent to the sub-oxided insertion layer 31b. Similarly, in the FIG. 4 example embodiment, an over-oxidized AZO layer may be provided adjacent to the sub-oxided insertion layer 41b. In certain example embodiments, the optional over-oxidized layer may be used as an internal source of oxygen during post-deposition baking. This may help "bake out" the optical absorption of the sub-oxided insertion layer after it has served its role in helping to form the AZO able to provide high haze. The optical absorption of such a layer may be from 1-3% (integrated over 400-700 nm wavelength range, for example) in certain example embodiments. The over-oxided layer may be about 20-100 nm thick, more preferably 40 nm thick, in certain example embodiments. In certain example embodiments, the over-oxided layer may be provided below the sub-oxided insertion layer. A temporary over-oxided layer also may be provided in embodiments where graded layers are used in accordance with certain example embodiments.

Third, the ITO may be ion-beam treated before providing the top AZO layer. The harsh ion beam treatment of this technique may be used to at least partially erode the upper portion of the ITO so that the AZO layer is not as affected by the ITO crystallinity. This illustrative arrangement is shown, for example, in FIG. 5. The FIG. 5 example embodiment includes a glass substrate 1, which supports a dielectric layer 2 and a multi-layer TCC 51. The multi-layer TCC includes an ITO layer 51a that has been ion-beam treated in the region 51b. The ion-beam treatment in the region 51b affects the crystallinity of at least a portion of the deposited ITO which, in turn, enables the AZO layer 51c to grow and form peaks and valleys as described above.

The ion beam may be implemented at the end of the ITO layer deposition, and the ion beam may use Ar, $O_2$, and/or any suitable combination of these and/or other gasses. In general, an ion-beam voltage of greater than about 500 V will sufficiently roughen the ITO surface; however a voltage greater than 1000 V is preferred, and a voltage of 3000 V sometimes may be used.

Ion beams, ion sources, ion beam treatments, and the like are disclosed, for example, U.S. Pat. Nos. 6,808,606; 7,030,390; 7,183,559; 7,198,699; 7,229,533; 7,311,975; 7,405,411; 7,488,951; and 7,563,347, and U.S. Publication Nos. 2005/0082493; 2008/0017112; 2008/0199702, the entire contents of each of which is hereby incorporated herein by reference.

In certain example embodiments, some or all of the layers may be sputter-deposited. Of course, some or all of the layers may be deposited by other techniques such as, for example, wet-chemical techniques, pyrolytic techniques, CVD, and/or the like.

In certain example embodiments, the dielectric layer 2 may be a single layer or a multi-layer stack. The dielectric layer or dielectric layer stack may be provided directly on the glass substrate. For example, in certain example embodiments, the dielectric layer 2 may comprise titanium oxide, silicon oxide, silicon nitride, silicon oxynitride, zirconium oxide, and/or the like. Indeed, any transparent or partially transparent dielectric layer may be used in different example embodiments of this invention, alone or in a layer stack with the same or different dielectric layers. If a titanium oxide layer is provided, it may in certain example embodiments have a thickness of 0-30 nm, more preferably 5-20 nm, and still more preferably about 7 nm. If a silicon oxynitride layer is provided, it may in certain example embodiments have a refractive index of 1.5-1.9 or, more preferably, of about 1.6. Furthermore, if a silicon oxynitride layer is provided, it may in certain example embodiments have a thickness of 0-80 nm, more preferably 10-50 nm, and still more preferably about 30 nm.

Although certain example embodiments have been described as having a layer of AZO, other transparent conductive coatings may be used in place of or in addition to the AZO. For example, transparent conductive oxide (TCO) coatings such as ITO, indium gallium zinc oxide, indium gallium oxide, indium zinc oxide and/or combinations thereof may be used in place of, or in addition to, the AZO.

In certain example embodiments, the entire contact assembly may be post-deposition baked and/or heat treated. Such baking and/or heat treating in certain example embodiments may be performed at a temperature of 200-550 degrees C., more preferably about 400 degrees C. The baking and/or heat treating may be performed in certain example embodiments for 1-30 minutes, more preferably 10-30 minutes. Such baking and/or heat treating advantageously may help increase transmission and conductivity, e.g., by making some or all of the layers more crystallized. Baking and/or heat treating may be performed before or after the etching, in different embodiments of this invention.

In certain example embodiments, the AZO layer may have a haze from 5-95%, more preferably at least about 40%.

Any suitable semiconductor may be used in connection with different embodiments of this invention. For example, certain example embodiments may incorporate an a-Si single junction solar cell, an a-Si tandem-junction solar cell, and/or the like. As alluded to above, the insertion layers and/or the roughening via ion-beam treatment advantageously may help serve as an etch stop, reducing the likelihood that craters produced during etching will go all of the way through the AZO layer and form shorts. The incorporation of the insertion layers and/or the roughening via ion-beam treatment advantageously also may help overcome optical mismatch problems as between the various layers in the overall solar cell.

As used herein, the terms "on," "supported by," and the like should not be interpreted to mean that two elements are directly adjacent to one another unless explicitly stated. In other words, a first layer may be said to be "on" or "supported by" a second layer, even if there are one or more layers therebetween.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of making a front contact for a solar cell, the method comprising:
providing a glass substrate;
disposing a dielectric coating on the glass substrate;
disposing a layer of stoichiometric ITO on the dielectric coating;
sputter-depositing a layer of AZO on the layer of stoichiometric ITO, the layer of AZO being sputter-deposited at a temperature less than 200 degrees C.;
etching the layer of AZO; and
sputter-depositing an insertion layer including sub-oxidized ITO or sub-oxidized AZO between the layer of AZO and the layer of stoichiometric ITO, the insertion layer altering the crystalline growth of the layer of AZO compared to a situation where no insertion layer is provided;
baking and/or heat treating the substrate together with the dielectric coating, the layer of stoichiometric ITO, and the layer of AZO.

2. The method of claim 1, wherein the temperature at which the layer of AZO is sputter-deposited is about room temperature.

3. The method of claim 1, wherein the etching comprises etching with an acetic acid solution.

4. The method of claim 1, wherein the etching is performed before the baking and/or heat treating.

5. The method of claim 1, wherein the etching is performed after the baking and/or heat treating.

6. The method of claim 1, wherein the dielectric coating comprises titanium oxide and/or silicon oxide.

7. The method of claim 1, wherein the insertion layer is sub-oxidized ITO, and has an absorption of 3-6% per 100 nm of thickness.

8. The method of claim 1, wherein the insertion layer is sub-oxidized AZO, and has an absorption of 2-8% per 100 nm of thickness.

9. The method of claim 1, wherein the insertion layer comprises less oxygen than the layer of AZO.

10. The method of claim 1, wherein the insertion layer shifts the 002 peak of the layer of AZO compared to a situation where no insertion layer is provided.

11. The method of claim 1, further comprising providing an over-oxidized layer adjacent to the insertion layer, the over-oxidized layer and the insertion layer comprising common elements.

12. The method of claim 1, wherein the layer of stoichiometric ITO is graded such that there is more oxygen closer to the AZO and less oxygen closer to the dielectric coating.

13. The method of claim 1, wherein the layer of AZO is graded such that there is more oxygen closer to the AZO and less oxygen closer to the dielectric coating.

14. A method of making a solar cell, the method comprising:
    connecting the front contact of claim 1 to an a-Si semiconductor layer.

15. A method of making a front contact for a solar cell, the method comprising:
    providing a glass substrate;
    sputter-depositing a dielectric coating on the glass substrate;
    sputter-depositing a layer of stoichiometric ITO on the dielectric coating;
    sputter-depositing a layer of AZO on the layer of stoichiometric ITO; and
    sputter-depositing an insertion layer including sub-oxidized ITO or sub-oxidized AZO between the layer of AZO and the layer of stoichiometric ITO, the insertion layer altering the crystalline growth of the layer of AZO compared to a situation where no insertion layer is provided.

16. The method of claim 15, wherein the insertion layer comprises sub-oxidized ITO and has an absorption of 3-6% per 100 nm of thickness.

17. The method of claim 15, wherein the insertion layer comprises sub-oxidized AZO and has an absorption of 2-8% per 100 nm of thickness.

18. The method of claim 15, wherein the AZO sputter-deposition is performed without any intentional heating of the glass substrate.

19. The method of claim 15, further comprising etching the layer of AZO.

20. The method of claim 15, further comprising baking and/or heat treating the substrate together with the dielectric coating, the layer of stoichiometric ITO, the layer of AZO, and the insertion layer.

21. A method of making a solar cell, the method comprising:
    connecting the front contact of claim 15 to an a-Si semiconductor layer.

22. A front contact for a solar cell, comprising:
    a glass substrate;
    a dielectric coating disposed on the glass substrate;
    a layer of stoichiometric ITO disposed on the dielectric coating; and
    a layer of AZO sputter-deposited on the layer of ITO at a temperature less than 200 degrees C.;
    an insertion layer provided between the layer of AZO and the layer of stoichiometric ITO; wherein the insertion layer comprises sub-oxidized ITO or sub-oxidized AZO, the insertion layer altering the crystalline growth of the layer of AZO compared to a situation where no insertion layer is provided,
    wherein the layer of AZO is etched,
    wherein the substrate is baked and/or heat treated together with the dielectric coating, the layer of stoichiometric ITO, and the layer of AZO.

23. The front contact of claim 22, wherein the temperature at which the layer of AZO is sputter-deposited is about room temperature.

24. The front contact of claim 22, wherein the dielectric coating comprises titanium oxide and/or silicon oxide.

25. The front contact of claim 22, wherein the insertion layer is sub-oxidized ITO, and has an absorption of 3-6% per 100 nm of thickness.

26. The front contact of claim 22, wherein the insertion layer is sub-oxidized AZO, and has an absorption of 2-8% per 100 nm of thickness.

27. The front contact of claim 22, wherein the insertion layer is provided with an oxygen content selected so that the insertion layer sufficient to alter the crystalline growth of the layer of AZO compared to a situation where no insertion layer is provided.

28. The front contact of claim 27, wherein the insertion layer is provided with an oxygen content selected so that the insertion layer sufficient to shift the 002 peak of the layer of AZO compared to a situation where no insertion layer is provided.

29. The front contact of claim 22, wherein the layer of stoichiometric ITO is graded such that there is more oxygen closer to the AZO and less oxygen closer to the dielectric coating.

30. The front contact of claim 22, wherein the layer of AZO is graded such that there is more oxygen closer to the AZO and less oxygen closer to the dielectric coating.

31. A solar cell, comprising:
    a front contact according to claim 22; and
    an a-Si semiconductor layer.

32. A front contact for a solar cell, comprising:
    a glass substrate;
    a dielectric coating sputter-deposited on the glass substrate;
    a layer of stoichiometric ITO sputter-deposited on the dielectric coating;
    a layer of AZO sputter-deposited on the layer of stoichiometric ITO; and
    a sputter-deposited insertion layer including sub-oxidized ITO or sub-oxidized AZO provided between the layer of AZO and the layer of stoichiometric ITO,
    wherein the insertion layer is provided with an oxygen content selected so that the insertion layer sufficient to alter the crystalline growth of the layer of AZO compared to a situation where no insertion layer is provided.

33. The front contact of claim 32, wherein the insertion layer is sub-oxidized ITO and has an absorption of 3-6% per 100 nm of thickness.

34. The front contact of claim 32, wherein the insertion layer is sub-oxidized AZO and has an absorption of 2-8% per 100 nm of thickness.

35. The front contact of claim 32, wherein the layer of AZO is etched.

36. A solar cell, comprising:
    a front contact according to claim 32; and
    an a-Si semiconductor layer.

* * * * *